United States Patent
Morita et al.

(10) Patent No.: US 7,218,115 B2
(45) Date of Patent: *May 15, 2007

(54) SUPERCONDUCTOR PROBE COIL FOR NMR APPARATUS

(75) Inventors: Hiroshi Morita, Mito (JP); Michiya Okada, Mito (JP); Tsuyoshi Wakuda, Hitachi (JP); Tomomi Kikuta, Hitachi (JP); Minseok Park, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/227,291

(22) Filed: Sep. 16, 2005

(65) Prior Publication Data

US 2006/0006868 A1    Jan. 12, 2006

Related U.S. Application Data

(63) Continuation of application No. 10/804,106, filed on Mar. 19, 2004, now Pat. No. 7,053,619.

(30) Foreign Application Priority Data

Apr. 24, 2003    (JP) .............................. 2003-120208

(51) Int. Cl.
*G01V 3/00*    (2006.01)
(52) U.S. Cl. ...................... 324/322; 324/318
(58) Field of Classification Search ............... 324/318,
324/319, 321, 322, 307, 309, 300; 600/410,
600/420, 421, 422
See application file for complete search history.

(56) References Cited

U.S. PATENT DOCUMENTS

| | | | | |
|---|---|---|---|---|
| 3,419,794 A | * | 12/1968 | Weaver, Jr. et al. | 324/319 |
| 3,764,892 A | * | 10/1973 | Rollwitz | 324/322 |
| 5,258,710 A | * | 11/1993 | Black et al. | 324/309 |
| 5,565,778 A | * | 10/1996 | Brey et al. | 324/318 |
| 5,594,342 A | * | 1/1997 | Brey et al. | 324/322 |
| 6,169,402 B1 | * | 1/2001 | Oka et al. | 324/318 |
| 6,198,281 B1 | * | 3/2001 | Wand et al. | 324/300 |
| 6,221,984 B1 | | 4/2001 | Kersting et al. | |
| 6,574,495 B1 | | 6/2003 | Golman | |
| 6,735,851 B2 | * | 5/2004 | Romo et al. | 29/606 |
| 6,828,791 B2 | * | 12/2004 | Morita et al. | 324/318 |
| 6,836,112 B2 | | 12/2004 | Hennessy | |
| 7,053,619 B2 | * | 5/2006 | Morita et al. | 324/318 |

(Continued)

FOREIGN PATENT DOCUMENTS

JP    11-133127    5/1999

(Continued)

OTHER PUBLICATIONS

.Eisenschmid et al ; Journal of the American Chemical Society (1987), 109(26), 8089-91.*

(Continued)

*Primary Examiner*—Brij B. Shrivastav
(74) *Attorney, Agent, or Firm*—Antonelli, Terry, Stout & Kraus, LLP.

(57) ABSTRACT

An NMR apparatus which includes an NMR probe coil of a superconductor made of magnesium 2-boride formed on the surface of a substrate made of a flexible organic polymer material.

10 Claims, 6 Drawing Sheets

U.S. PATENT DOCUMENTS

| | | | |
|---|---|---|---|
| 7,084,635 B2* | 8/2006 | Morita et al. | 324/322 |
| 2002/0173428 A1* | 11/2002 | Thieme et al. | 505/100 |
| 2004/0046556 A1 | 3/2004 | Okada et al. | |
| 2004/0180792 A1* | 9/2004 | Abe et al. | 505/452 |
| 2004/0204322 A1 | 10/2004 | Tanaka | |
| 2004/0245506 A1 | 12/2004 | Zhu et al. | |
| 2004/0250410 A1 | 12/2004 | Grasso | |
| 2004/0251902 A1 | 12/2004 | Takagi | |
| 2005/0068034 A1 | 3/2005 | Morita et al. | |
| 2005/0163644 A1* | 7/2005 | Thieme et al. | 419/4 |

FOREIGN PATENT DOCUMENTS

| | | |
|---|---|---|
| WO | 03/019589 | 3/2003 |

OTHER PUBLICATIONS

Arata, *Book of NMR*, published by Maruzen, pp. 324-327 (2000).

Kus et al., "Superconducting Properties of MgB2 Thin Films Prepared On Flexible Plastic Substrates", *Applied Physics Letters*, vol. 81, No. 12, pp. 2199-2201 (Sep. 16, 2002).

Nagamatsu et al., "Superconductivity at 39K in Magnesium Diboride", *Nature*, vol. 410, pp. 63-64 (Mar. 1, 2001).

Tanaka et al., "Transport Properties of PIT Processed MgB2 Wire and Coil", pp. 148 (2002).

Flukiger et al "Superconducting Properties of MbB2 Tapes and Wires" Physica, North-Holland Publishing, Amsterdam, NL, vol. 385 No. 1-2, Mar. 1, 2003 pp. 286-305.

Malogoli et al, Radio Frequency Response of Ag-Sheathed (Bl, Pb)2Sr2Ca2Cu3O10+x Superconducting Tapes, Physica C., North-Holland Publishing, Amsterdam, NL vol. 378-381, Oct. 2002 pp. 1087-1090.

Tanaka et al, Fabrication and Transport Properties of MgB2 Wire and Coil, Physica, North-Holland Publishing, Amsterdam, NL, vol. 382, No. 2-3, Nov. 1, 2002 (pp. 203-206).

* cited by examiner 201    202

201    202

201    202

SUPERCONDUCTOR PROBE COIL FOR NMR APPARATUS

CROSS-REFERENCE OF THE RELATED APPLICATION

This application is a continuation of U.S. application Ser. No. 10/804,106, filed Mar. 19, 2004 now U.S. Pat. No. 7,053,619, the contents of which are incorporated herein by reference.

The Japanese patent application of 2003-120208, filed on Apr. 24, 2003, on which the present application claims the priority of Paris Convention.

DESCRIPTION OF THE INVENTION

1. Field of the Invention

The present invention relates to a probe coil for a nuclear magnetic resonance apparatus.

2. Related Art

In general, as NMR (Nuclear Magnetic Resonance) apparatuses, there are a CW type wherein electromagnetic wave of radio frequency is irradiated continuously to a sample, and a pulse Fourier type wherein electromagnetic waves of pulse form are irradiated to the sample. In recent years, the latter pulse Fourier type apparatus is represented as NMR apparatuses. In this specification, the NMR apparatus is used to mean the pulse Fourier type NMR apparatus, unless otherwise specified.

The non-patent publication 1 discloses a fundamental structure of the NMR apparatus. According to the non-patent publication 1, the NMR apparatus comprises a superconductor magnet, a probe having a probe coil disposed therein, which coil irradiates high frequency pulse magnetic field to a sample and receives free-induction decay (FID) signals, a high frequency power source for supplying a high frequency current to the probe, an amplifier for amplifying the free induction decay signals, a detector for detecting the signals, an analyzer for analyzing the signals detected by the detector, etc. There are probes having plural coils so as to prepare for various kinds of nuclides or detecting methods.

The probes have, in general, both a function for irradiating the high frequency pulse magnetic field to the sample, and a function for receiving the free induction decay signals emitted from the sample.

A low temperature probe is one type of the probes. According to the non-patent publication 1, the low temperature probe has a circuit of superconductor, whereby the inside of the probe is cooled by low temperature helium gas. As the superconductor, oxide superconductors are used.

There re two advantages of the low temperature probe, one of which is an increased Q value of the coil. The Q value is expressed by the (equation 1).

(Equation 1)

$$Q = \sqrt{(L/C \cdot 1/R)} \quad \text{(equation 1)}$$

In the equation 1, L means inductance of a circuit, C capacitance, and R resistance. According to the equation 1, it is seen that the smaller the electrical resistance, the higher the Q value becomes.

The other is to increase an S/N ratio by reducing a thermal noise of the total circuit, since the low temperature is realized. A nose potential is expressed by the equation 2.

(Equation 2)

$$Vn = \sqrt{(4kT\Delta fR)} \quad \text{(equation 2)}$$

In the equation 2, k is Boltzmann constant, T a temperature, $\Delta f$ a frequency width, and R an electric resistance. According to the equation 2, it is seen that the higher the temperature, the smaller the noise voltage Vn becomes.

In case of normal metals, the lower the temperature, the smaller the electric resistance R becomes. Accordingly, the noise voltage Vn can be made small in proportion of at least ½ power of the electric resistance.

Related art concerning the above-mentioned technology is disclosed in a patent publication 1, wherein in order to reduce thermal noise, a bird-cage type probe coil that uses a superconductor cooled to a low temperature is employed to improve the S/N ratio.

In this case, as the superconductor, high temperature superconductors such as YBCO ($YB_2Cu_3O_{7-x}$, yttrium series superconductors) are used to the straight part of the bird-cage type coil.

When the low temperature probe that uses the oxide superconductors is applied to the probe coil, the following problems will arise.

(1) Generally, oxide superconductors used in the low temperature probe the YBCO thin films; it is difficult to manufacture other shapes than a flat plate, as long as the present technology is used.

(2) The oxide superconductors containing YBCO has the strong dependency on a magnetic orientation of a transfer current. The dependency is the relationship between orientation of the magnetic field and the transfer current. Thus, in the thin film conductors, it will be been understood that a critical current will drastically drop if a magnetic field perpendicular to the thin film surface is applied.

(3) Further, the oxide superconductor containing YBCO worsens its critical current if a stress is applied thereto. Thus, it is impossible to bend the superconductor, and it was difficult to make desired shapes freely after the thin film is formed.

As having been described, it was difficult to make probe coils of the superconductor having a complicated figure. Therefore, application of the superconductors to the probe coils was limited to only the straight portion. Further, if other superconductors are employed, superconductors such as a powder-in-tube superconductor wires by a conventional extrusion process, superconductor wires with an external stabilizer, superconductor wires in which a superconductor is formed on a metallic substrate of good electric conductivity have an electro-magnetic shield, which surrounds the superconductor, so that generation of a high frequency pulsating magnetic field and detection of FID signals become impossible.

As is reported in the non-patent document 2, it was found that magnesium 2-boride ($MgB_2$) exhibited superconductivity.

Features of magnesium 2-boride are as follows.

(a) The critical temperature of magnesium 2-boride is 39K, which is the highest among metallic superconductors.

(b) The critical magnetic field at 0K is about 18T, which belongs to a higher group, when compared with metallic superconductor materials.

(c) According to the research (non-patent publication 3), it has been revealed that a wire material manufactured by the powder-in-tube process had good bending stress characteristics, and that the critical current was not worsened even when a maximum bending stress of 0.88% is applied to the wire.

Because the bending stress characteristics of magnesium 2-boride, the wire can be formed relatively freely. The wire is suitable for the low temperature probe coil material as it has the high critical temperature and high critical magnetic field. However, the wire made by the powder-in-tube using a metal tube cannot be used as the low temperature probe coil as magnesium 2-boride superconductor is covered with metal.

On the other hand, a method of forming a magnesium conductor by a thin film process has been investigated. According to the non-patent publication 4, it is reported that a thin film of magnesium 2-boride is deposited on a polyimide tape by a vacuum vapor deposition. Since its bending stress characteristics seem to be good, the conductor made by the process may be suitable for the low temperature probe.

There are following problems in constituting the low temperature probe using the magnesium 2-boride superconductor.

(I) Although the magnesium 2-boride superconductor made by the powder-in-tube method using a metallic tube has good bending stress characteristics, and high critical temperature and high critical magnetic field, an electric current does not flow through the superconductor in the metal tube because the metallic tube surrounding the conductor becomes the magnetic shield.

Further, it is difficult to keep the shape of the magnesium 2-boride superconductor as it is, when the outer metal is removed by a mechanical or chemical process.

(II) In a method wherein the magnesium 2-boride superconductor is deposited on the polyimide tape by the vacuum vapor deposition, the polyimide tape which is an electric insulator is not an electro-magnetic shield, but since polyimide contain hydrogen atom nuclides therein which are the most important subject to be measured in NMR, analysis was difficult because measurement spectrum always includes the spectrum stemming from hydrogen contained in polyimide that is superposed on the measured spectrum.

(III) The present inventors have conducted experiments for forming magnesium 2-boride superconductor thin film by the vacuum vapor deposition method. However, it has been revealed that the critical current of the superconductor thin film formed on polyimide tape was only ½ to ⅒ those of superconductors formed on a ceramic substrate or a single crystal substrate.

In order to investigate the cause, the composition of the polyimide tape was analyzed to find that the number of hydrogen atoms was reduced.

Further, it has been revealed that the number of water molecules increased in the magnesium 2-boride superconductor thin film.

From the above facts, it is conceived that hydrogen atoms spin out, by virtue of heating at the time of vacuum evaporation and they diffuse into the magnesium 2-boride thin film formed on the surface, and they react with oxygen atoms that remain in the thin film to produce water molecules.

The degradation of the critical current density of the magnesium 2-boride superconductor thin film may be caused by the water molecules. Accordingly, formation of the magnesium 2-boride superconductor thin film by the vacuum vapor deposition method is not preferable for the normal polyimide tape containing hydrogen atoms.

Non-patent publication 1; (A Book of NMR) (written by Youji Arata, Maruzen Publication, 2000), Part III, Measurement Technology Patent publication 2: Japanese Patent Laid-open Hei 11-133127

Non-patent document 2: Nature 410, pages 63–64, (2001)
Non-patent document 3: Tanaka, et al, The 66th 2002 Meeting on Cryogenics and Superconductivity, page 148
Non-patent document 4: P. Kus et al., Applied Physics Letters, vol. 81, page 2199 (2002)

SUMMARY OF THE INVENTION

Figure 1:
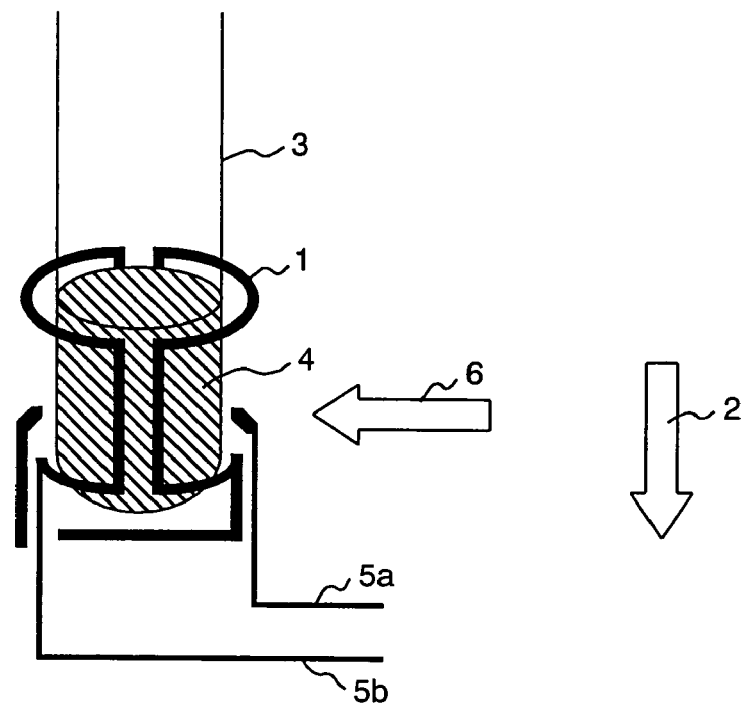
FIG. 1 is a diagrammatic perspective view of a probe coil for an NMR apparatus.

The present inventors noticed that the useful characteristics of the magnesium 2-boride superconductor, and conducted investigation whether magnesium 2-boride can be used as a low temperature probe coil for NMR of a solenoide type or not. As a result, the following means was applied in order to solve the problems.

As a first means, a superconductor using the magnesium 2-boride is formed on the surface of a flexible organic polymer material as the NMR apparatus probe coil.

As mentioned before, the magnesium 2-boride has good bending stress characteristics; thus it is possible to bend the substrate freely and is capable of forming desired shapes of probe coils, when the superconductor film is formed on the flexible organic polymer substrate.

A second means is that as the above-mentioned substrate, an organic polymer material that contains no hydrogen atoms is used.

In many cases, spectrum of hydrogen atoms are measured by the NMR apparatus; when a substrate that does not contain hydrogen atoms is used, spectrum of hydrogen atoms does not superpose on the measured spectrum so that accurate measurement of the sample by the NMR apparatus becomes possible.

A third means is to substitute all or part of hydrogen atoms with heavy hydrogen atoms.

Since nuclear resonance frequencies of heavy hydrogen and hydrogen are different, there is no influence of the substrate on the measured sample spectrum. Further, although the use of a substrate where all of the hydrogen atoms are substituted with heavy hydrogen is ideal, a substrate of which part of hydrogen atoms are substituted with heavy hydrogen atoms.

That is, there is no big influence on measurement if the strength of an NMR signal from hydrogen atoms contained in the substrate is weaker than that of an NMR signal from hydrogen atoms contained in the sample.

A fourth means is that the above-mentioned probe coil is constituted by any one of the saddle type, the bird cage type, the Helmholtz type, the one-turn type, the solenoide type, the pancake type and the combinations thereof.

When the above-mentioned probe coil is manufactured from the oxide superconductor, it is difficult to make coils for NMR apparatuses having desired shapes because of anisotropy with respect to the magnetic field of the superconductor. Further, in case of metal superconductors such as a superconductor made of a single element of NB, alloy superconductor of NbTi, cooling by liquid helium is necessary because of their low critical temperatures. In addition to the above, in case of compound metal series superconductors, their stress characteristics are bad, and making the desired shape of the probe coils is difficult, in general.

However, in case of manufacturing with magnesium 2-boride, there is no magnetic anisotropy, the critical temperature is relatively high, and stress characteristics are good. Accordingly, it is possible to realize the probe coils for NMR apparatuses with a high Q value, and a high S/N ratio, by employing the above-mentioned first, second and third means.

EMBODIMENTS OF THE INVENTION

EXAMPLE 1

FIG. 1 is a diagrammatic perspective view showing a saddle type probe coil for the NMR apparatus according to the present invention.

A coil 1 is constituted by two saddle type coils which are disposed at an outer periphery of a glass sample tube 3 so as to face each other. The glass sample tube 3 contains a sample to be measured.

The material of the coil 1 is magnesium 2-boride superconductor wire. The coil 1 constituted by one turn of two saddle type, and desired shape or the number of turns can be employed if the shape and the number of turns are the same.

The current leads 5a, 5b are bonded by soldering to the both ends of the coil 1. When current flows between the current leads 5a, 5b, the respective saddle coils generate magnetic fields in the direction of allows 6; a homogeneous magnetic field can be applied in the direction 6 of the allow at the center of the sample 4. The components are placed in the high homogeneous static magnetic field generated by the superconductor magnet. The direction of the high homogeneous static magnetic field is in the direction 2.

Although the coil 1 may be wound on a bobbin, a material of the coil bobbin should be a material having a specific magnetic ratio nearly 1, that is, the material should be one that has a magnetic transmission ratio which is almost the same as that of vacuum.

Since the coil 1 is supplied with a high frequency pulse current and the high frequency pulse magnetic field is applied, the material of the bobbin should be an insulator that does not transmit the high frequency magnetic field. Further, when the bobbin contains nuclides to be measured, the coil bobbin itself emits NMR signals, so that the signals cannot be distinguished from the NMR signals emitted from the measured sample 4. Thus, the care should be taken for the selection of the material for the bobbin. Accordingly, the coil bobbin is preferably made of glass containing a component for adjusting the magnetic transmission.

Not only the coil bobbin, but the sample tube 3 or a vacuum insulation which is formed at the outer periphery of the sample tube 3, which is not shown in the drawing, is preferably made of the special glass.

Figure 2:
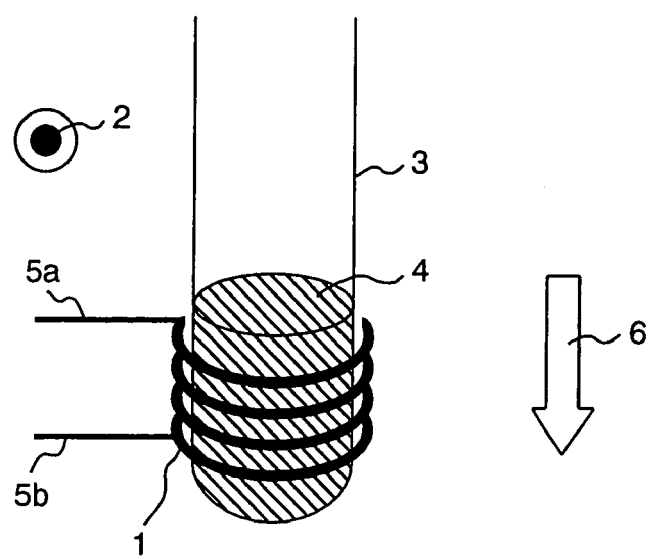
FIG. 2 is a diagrammatic perspective view of a solenoide type probe coil for an NMR apparatus.

The shape of the probe coil is not limited to the saddle type. FIG. 2 shows a perspective diagrammatic view of the probe coil, which employs a solenoide type coil. In this case, the direction of magnetic field generated by the probe coil is the same direction as that of an allow 6 at the center of the measurement sample 4. Thus, the direction of the high, homogeneous static magnetic field is perpendicular to the direction 6 or the direction 2.

Figure 3:
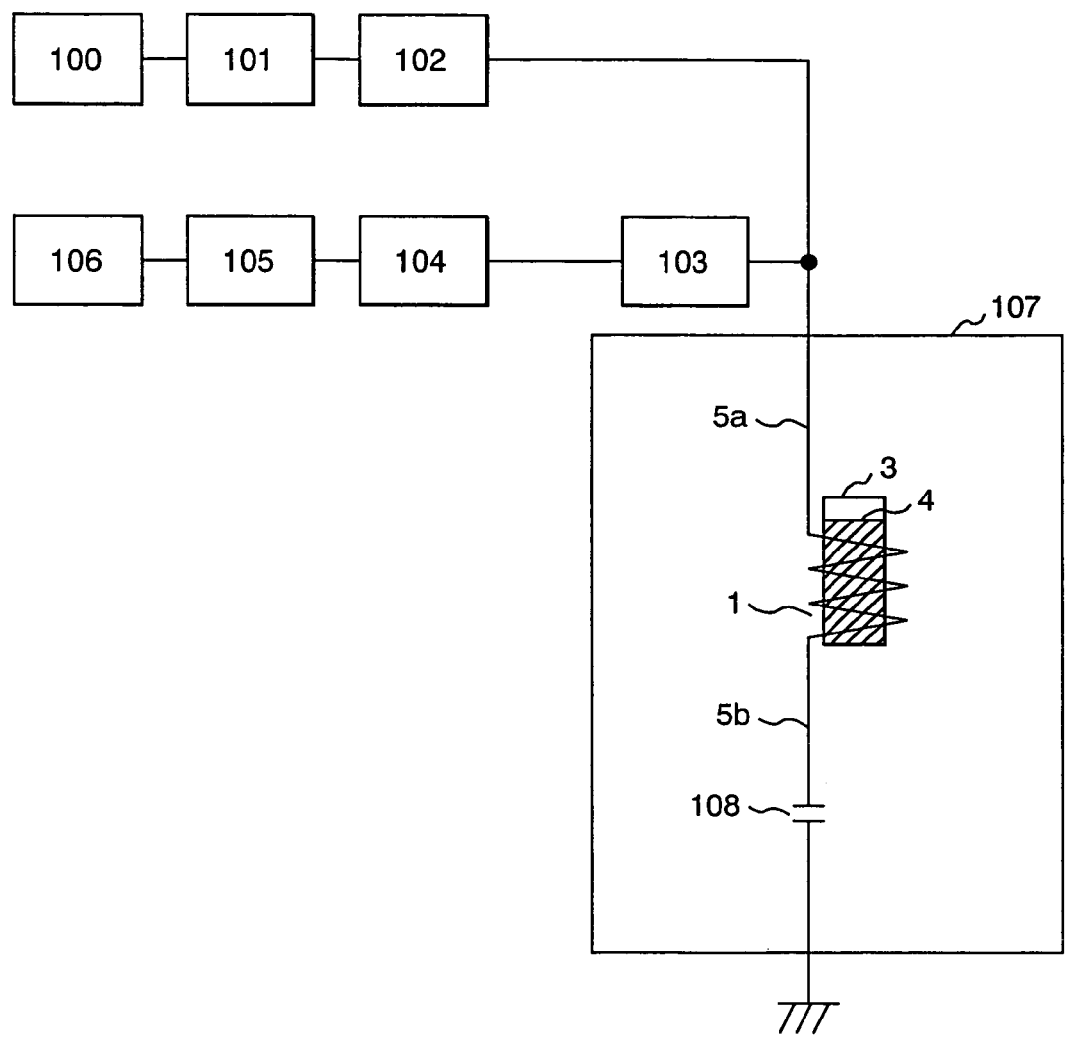
FIG. 3 is A block diagram of an NMR probe and a measurement system for NMR signals.

FIG. 3 shows the probe for the NMR apparatus and a measurement system for the NMR signal.

The probe 107 is provided with the coil 1, a condenser 108, etc. The coil 1 is cooled down to about 20K or lower. As preferable cooling methods, there are a method of dipping coil 1 in liquid helium (a liquid-cooling method), a method of supplying gaseous helium from outside (a gas-cooling method), a method of circulating gaseous, liquid or supercritical helium by an outside compressor (a forced-flow cooling method), a method of cooling by heat conduction using a small GM (Gifford-McMahon) cryocooler (a cryocooler-cooling method), etc.

Although not shown in FIG. 3, the probe 107 is disposed in a homogeneous magnetic field generated by the superconductor magnet. A high frequency power source generates on the coil 1, and a high frequency pulse current that is amplified by the power amplifier 102 is applied by means of the current leads 5a, 5b.

The frequency is calculated based on a magnetic circuit ratio of static magnetic field and nuclides to be measured. For example, when protons are detected in the static magnetic field of 2.35 T, the frequency is 100 MHz.

The pulse width is about several μs to several tens μs, though it may depend on the strength of magnetic field generated by the coil 1.

The power of the high frequency pulse current is generally several tens W to several hundreds W. The high pulse power current with a desired frequency, a pulse width and a sequence is generated by the controller 100.

In the following, operation of the NMR apparatus of the invention is explained. When the high frequency pulse current flows in the coil 1, a high pulse magnetic field is applied to the measuring sample 4 in the sample tube 3.

When nuclides that emit nuclear resonance are contained in the measuring sample 4, they cause nuclear resonance. After the high frequency pulse current is cut off, free induction decay (FID) signals are generated. The free induction decay signals are received y the coil 1, and the received signals are amplified by a pre-amplifier 103 and a signal amplifier 104.

The pre-amplifier 103 is cooled down to about 80 K so as to reduce noise. Although the cooling method of the coil is preferably employed as the cooling method of the amplifier, the cooling medium can be nitrogen instead of helium when the cooling medium is used. If the pre-amplifier 103 can be placed in such an environment that noise is sufficiently small, cooling of the pre-amplifier 103 is not necessary. The free induction decay signals that are amplified by the two stage amplifiers (103, 104) are detected by a detector 105 as signals having a range of several kHz. Further, the signals are subjected to Fourier development at a signal analyzer 106 to produce the NMR spectrum. Although there are accessories, etc. other than those described above, they are not shown.

Figure 4:
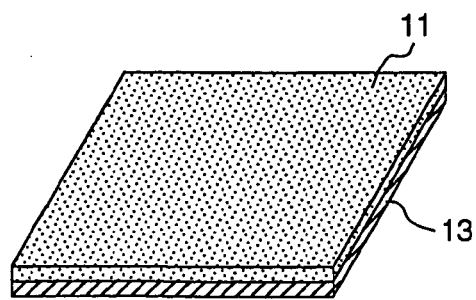
FIG. 4 is a perspective view of a magnesium 2-boride formed on an organic polymer substrate by a vacuum vapor deposition method.

FIG. 4 shows a perspective view of an example of a magnesium 2-boride superconductor formed on the organic polymer substrate, which is obtained by the vacuum vapor deposition method used in the present invention. As the organic polymer substrate 11, polytetrafluoroethylene sheet was used. Its thickness was about 1 mm or less; the magnesium 2-boride superconductor thin film 13 is formed on the sheet.

Theoretically, since polytetrafluoroethylene is an organic polymer material consisting essentially of carbon and fluorine, the substrate does not emit the NMR signals in case of the ordinary NMR apparatus. Thus, an accurate measurement of the sample is possible.

The thin film 13 of magnesium 2-boride superconductor formed by the vacuum vapor deposition method has a thickness of about 100 μm. When the conductor thus obtained is bent at a radius of 1 cm in the surface direction, the critical current of the conductor was 90% or more of the current of the conductor which is not bent. It has been confirmed that the degradation of the critical current due to bending stress was very small. The thin film can be made by other processes.

The substrate can be organic polymer materials having flexibility such as polyimide, polyethylene, epoxy resin, etc. It is preferable to substitute hydrogen atoms contained with heavy hydrogen atoms, whereby accurate spectrum can be obtained.

FIGS. 5 to 8 show examples of manufacturing various shapes of coils. The superconductors 201, which are cut into desired shapes and stereo structures 202 of the probe coils are shown.

Figure 5:
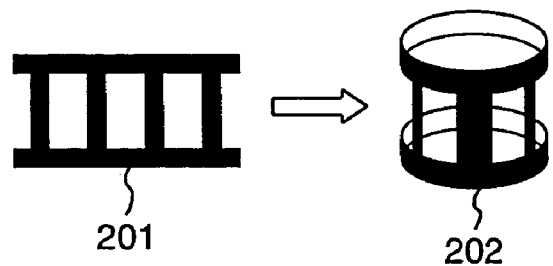
FIG. 5 is a diagrammatic view of an example of a process for manufacturing a birdcage type probe coil.
Figure 6:
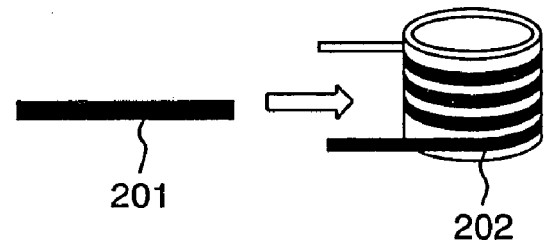
FIG. 6 is a diagrammatic view of an example of a process for manufacturing a solenoide type probe coil which has a conductor wound on a bobbin.
Figure 7:
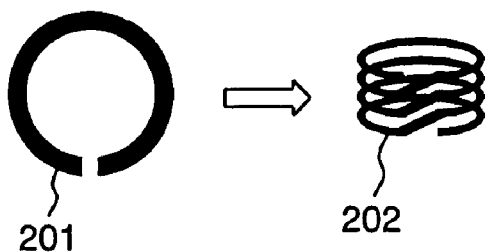
FIG. 7 is a diagrammatic view of an example of a process for manufacturing a solenoide type probe coil which has laminated conductors.
Figure 8:
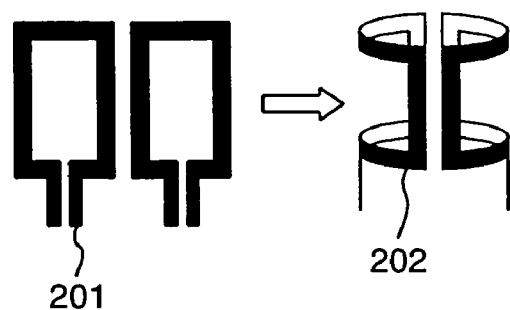
FIG. 8 is a diagrammatic view of an example of a process for manufacturing a saddle type probe coil.

FIG. 5 is a bird cage type, FIG. 6 a solenoide type wherein the conductors are wound around the bobbin, FIG. 7 a solenoide type wherein ring shaped conductors are laminated, and FIG. 8 an example of a method of manufacturing a saddle type.

In manufacturing the bird age type or the saddle type coil, the sheet is cut into a desired shape, and it is wound around a bobbin. Par of the superconductor is removed to form capacitor therein.

On the other hand, in manufacturing a solenoide type where the conductor is wound around the bobbin, the sheet is cut into narrow stripes, and they are wound around the bobbin. The solenoide coil wherein the ring shaped conductors are laminated uses several conductors of a donut shape cut out from the sheet, thereafter they are laminated on the co-axis, followed by electrical connection therebetween.

Figure 9:
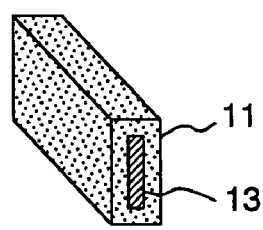
FIG. 9 is a diagrammatic view of a magnesium 2-boride superconductor, which is covered with an insulator of an organic polymer material, the superconductor being formed on an organic polymer substrate by a vacuum vapor deposition method.

FIG. 9 is a diagrammatic perspective view of the superconductor wherein an organic polymer insulator is applied on the periphery of magnesium 2-boride superconductor 13 formed on the organic polymer material substrate 11 by the vacuum vapor deposition method.

The superconductor is prepared by bonding another polyethylene sheet on the conductors of a stripe form cut from the conductor sheet. Organic polymer materials other than polytetrafluoroethylene can be used. Materials of which hydrogen atoms are substituted with heavy hydrogen are preferable. Since the magnesium 2-boride superconductor does not exposed to the atmosphere when the above-mentioned structure is employed, it is possible to prevent degradation by water, etc.

Figure 10:
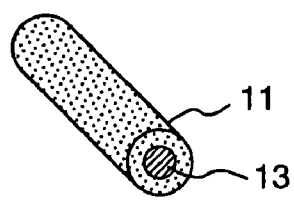
FIG. 10 is a diagrammatic view of a superconductor manufactured by a powder-in-tube method wherein magnesium 2-boride powder is used as the superconductor, and an organic polymer is used as an insulator.

FIG. 10 is a diagrammatic perspective view of the superconductor manufactured by a powder-in-tube method using magnesium 2-boride powder as a superconductor and an organic polymer as an insulator.

The conductor shown in FIG. 10 is prepared by the powder-in-tube method. In the conventional powder-in-tube method, powder of magnesium 2-boride is packed in a metal tube, followed by extrusion treatment, etc. For example, a polyethylene tube is inserted into a metal tube. Powder of magnesium 2-boride is packed in the inside of the tube, and the extrusion treatment, etc. is carried out. Then, the metal tube is removed to obtain a superconductor 13 of magnesium 2-boride covered with polyethylene.

Organic polymer materials other than polytetrafluoroethylene can be used. Materials of which hydrogen atoms are substituted with heavy hydrogen atoms are preferable.

According to these methods, the conductors having no electromagnetic effect by the metal at the outer periphery using the powder-in-tube method can be obtained. The outer metal can be removed by chemical dissolution with acid.

The present inventors conducted manufacture of the above-mentioned probe for the NMR apparatuses. The diameter of the saddle type coil 1 was 2 cm, and the length of the straight portion was 5 cm. The number of turn of the saddle coils was 1.

The coil 1 was cooled down to about 10 K by means of the gas cooling method using helium gas, and the re-amplifier 103 was cooled down to about 77K by means of the liquid-cooling method using liquid nitrogen. The thus prepared probe for the NMR apparatus was placed in a high homogeneous static magnetic field of 2.35 T; spectrum of proton NMR in ethanol was measured using a high frequency power source of 100 MHz, which is a resonance frequency of proton.

Further, a probe was prepared for comparison wherein the coil 1 was made of cupper. The proton NMR spectrum was measured, while coil 1 and the pre-amplifier 103 were kept at room temperature without cooling.

As a result of a series of tests, as for the S/N ratio, the probe using the magnesium 2-boride superconductor wire as the coil 1 was 5 times better than the probe using cupper. And Q value of the former was 10 times better than the latter.

As having been described above, it was possible to realize the probe coil for NMR apparatus with improved Q value and S/N ratio by using as the probe coil the superconductor constituted by magnesium 2-boride superconductor.

Figure 11:
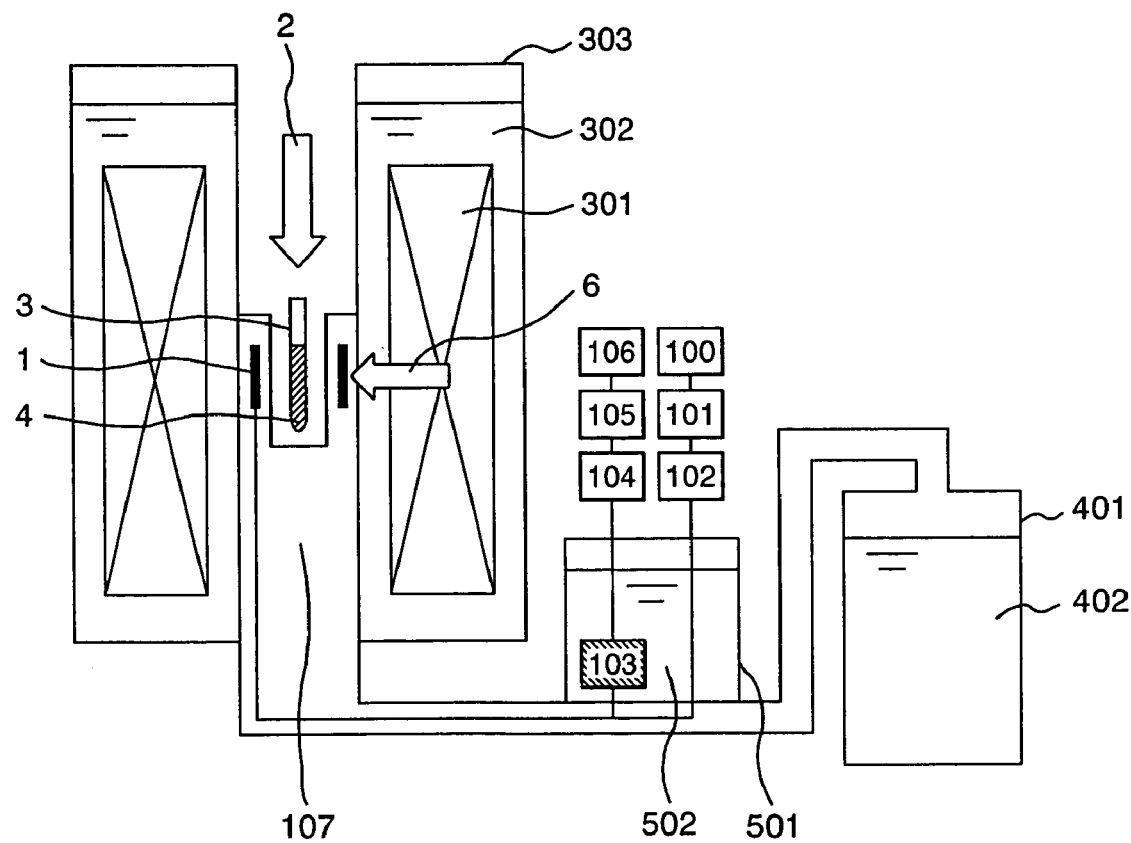
FIG. 11 is a diagrammatic view of an example of an NMR apparatus that has a superconductor probe for the NMR apparatus according to the present invention.

An example of an NMR apparatus equipped with the superconductor probe for the NMR apparatus according to the present invention is shown in FIG. 11.

The coil 1 disposed in the probe 107 is a coil that uses magnesium 2-boride. The shape of the coil 1 is preferably a birdcage type which can generate high frequency pulse in the horizontal direction or in the direction of direction 6. A saddle type shown in FIG. 8 is also preferable. A solenoide type having the center axis in the direction of direction 6 may be used.

Preferable superconductors for coils 1 are shown in FIGS. 4, 9 or 10. The coils 1 are cooled with vaporized gas of liquid helium for cooling the probe, the liquid being stored in a cryostat 401. In this apparatus the gas-cooled method is employed, the coil 1 may be cooled by the above-mentioned methods such as the liquid-cooling method, the forced-cooling method, or the cryocooler-cooling method.

If the temperature of the coil 1 is 39 K, which is the critical temperature of magnesium 2-boride or lower is acceptable, but about 10K or lower is preferable to attain a large transport current. The coil 1 to which the controller 100, the high frequency power source 101 and the power amplifier 102 are connected can generate the high frequency pulse magnetic field.

The coil 1 receives FID signals from the sample 4 placed in the sample tube 3, and the signals are amplified by the pre-amplifier 103 and the signal amplifier 104, then the signals are detected by the detector 10 so that the NMR spectrum is obtained by means of the signal analyzer 106. The pre-amplifier 103 is placed in the cryostat 501 and is cooled by liquid nitrogen for the pre-amplifier to 77K so as to lessen noise.

The probe 107 is placed in a room temperature bore, which passes through, in the vertical direction, the cryostat 303 that accommodates the superconductor coil 301 and liquid helium 302. The superconductor 301 is the solenoide type coil, which can generate the static magnetic field in the vertical direction 2. The superconductor coil 301 can be constituted by plural coils so that high homogeneous static magnetic field is formed at the position of the sample 5.

In order to compensate an abnormal magnetic field due to outer turbulence or anisotropy of the superconductor coils 301, it is preferable to install a superconductor or normal conductor coil that generates magnetic field in the direction other than the direction 2. According to the above mentioned measures, an NMR apparatus having a high Q value and the high S/N ratio will be realized.

Figure 12:
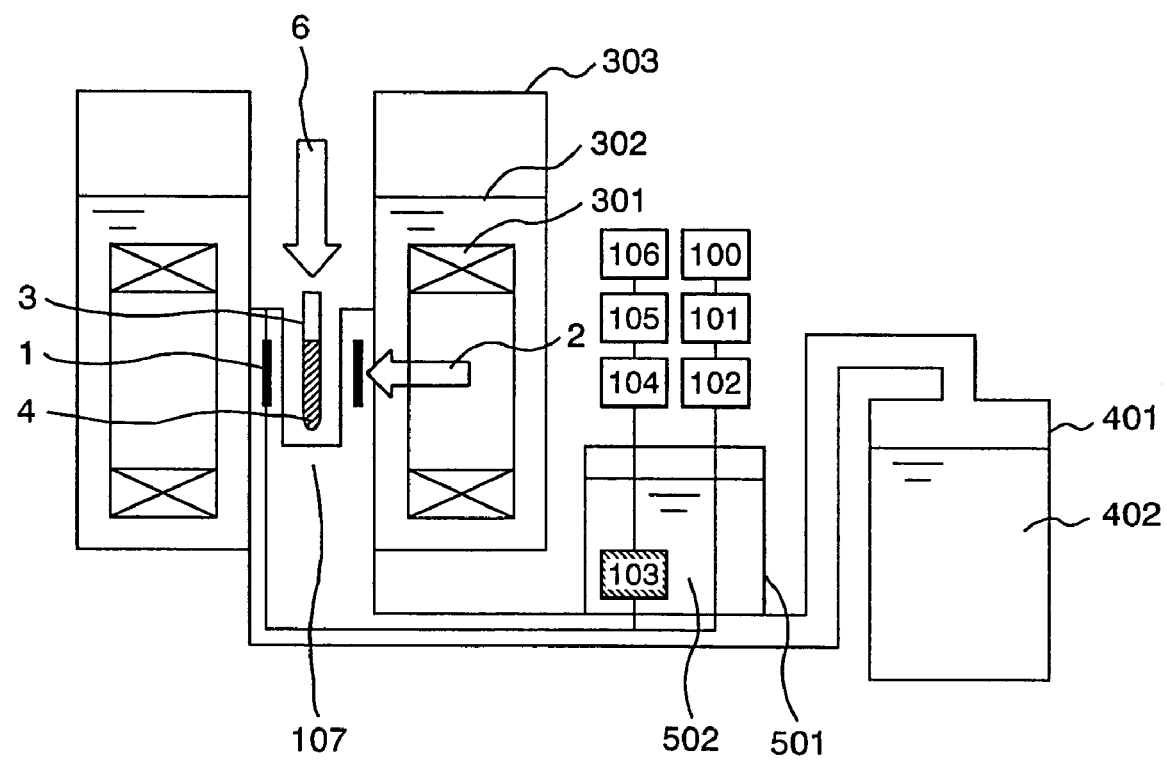
FIG. 12 is a diagrammatic view of another example of an NMR apparatus that has a superconductor probe for the NMR apparatus according to the present invention.

Further, FIG. 12 shows a concrete example of an NMR apparatus which is provided with the superconductor probe for the NMR apparatus.

The point of FIG. 12 different from that of FIG. 11 is that the direction 2 of static magnetic field, which is generated by the superconductor coil 301 is the horizontal direction, while in FIG. 11, the direction is on the vertical direction. Another point is that the direction 6 of the high frequency pulse magnetic field generated by the coil 1 is horizontal in case of FIG. 11, while the direction in case of FIG. 12 is vertical.

In order to place the probe 107 at room temperature, a preferable superconductor coil 301 is a symmetric type coil, which is called a split type. Plural coils are acceptable, as same as in the case of FIG. 11. Installment of a shim coil is preferable. When the superconductor 301 is the split coil type, the height of the apparatus can be made lower than the case shown in FIG. 11.

According to the present invention, desired shapes can be made; there is no degradation of characteristics caused by hydrogen during manufacturing the superconductors; hydrogen spectrum is not superposed, while measuring the NMR signals; the probe for the NMR apparatus having no electromagnetic shield effect by metal sheath of the conductor can be provided.

What is claimed is:

1. An NMR apparatus comprising an NMR probe coil of a superconductor made of magnesium 2-boride formed on the surface of a substrate made of a flexible organic polymer material and a solenoid type superconductor coil that generates static magnetic field in a horizontal direction, wherein the substrate is made of an organic polymer containing hydrogen atoms, and all or part of the hydrogen atoms contained in the material are substituted with heavy hydrogen atoms.

2. The NMR apparatus according to claim 1, wherein the probe coil is constituted by any one of a saddle type, a bird cage type, a Helmholtz type, a one-turn type, a solenoid type, a pancake type and combinations thereof.

3. The NMR apparatus according to claim 1, wherein the superconducting coil is a split type coil.

4. An NMR apparatus comprising an NMR probe coil of a superconductor made of magnesium 2-boride formed on the surface of a substrate made of a flexible organic polymer material and a solenoid type superconductor coil that generates static magnetic field in a horizontal direction, wherein the substrate is made of an organic polymer material that contains no hydrogen atoms.

5. The NMR apparatus according to claim 4, wherein the probe coil is constituted by any one of a saddle type, a bird cage type, a Helmholtz type, a one-turn type, a solenoid type, a pancake type and combinations thereof.

6. The NMR apparatus according to claim 4, wherein the superconducting coil is a split type coil.

7. An NMR apparatus comprising an NMR probe coil of a superconductor made of magnesium 2-boride formed on the surface of a substrate made of a flexible organic polymer material, wherein the substrate is made of an organic polymer material containing hydrogen atoms, and all or part of the hydrogen atoms contained in the material are substituted with heavy hydrogen atoms.

8. The NMR apparatus according to claim 7, wherein the probe coil is constituted by any one of a saddle type, a bird cage type, a Helmholtz type, a one-turn type, a solenoid type, a pancake type and combinations thereof.

9. An NMR apparatus comprising an NMR probe coil of a superconductor made of magnesium 2-boride formed on the surface of a substrate made of a flexible organic polymer material, wherein the substrate is made of an organic polymer material that contains no hydrogen atoms.

10. The NMR apparatus according to claim 9 wherein the probe coil is constituted by any one of a saddle type, a bird cage type, a Helmholtz type, a one-turn type, a solenoid type, a pancake type and combinations thereof.

* * * * *